United States Patent
Hashimoto et al.

(10) Patent No.: US 9,331,297 B2
(45) Date of Patent: May 3, 2016

(54) ORGANIC EL DISPLAY DEVICE AND METHOD FOR MANUFACTURING SAME

(71) Applicant: PANASONIC CORPORATION, Osaka (JP)

(72) Inventors: Jun Hashimoto, Osaka (JP); Kaname Mizokami, Kyoto (JP); Kazuo Uetani, Hyogo (JP); Akira Takiguchi, Hyogo (JP); Kenji Harada, Hyogo (JP); Ken Ito, Osaka (JP); Takuya Sato, Kyoto (JP); Masaki Nishimura, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/408,021

(22) PCT Filed: Jun. 14, 2013

(86) PCT No.: PCT/JP2013/003743
§ 371 (c)(1),
(2) Date: Dec. 15, 2014

(87) PCT Pub. No.: WO2013/190813
PCT Pub. Date: Dec. 27, 2013

(65) Prior Publication Data
US 2015/0179967 A1    Jun. 25, 2015

(30) Foreign Application Priority Data
Jun. 21, 2012 (JP) ................ 2012-139309

(51) Int. Cl.
*H01L 21/02* (2006.01)
*H01L 51/50* (2006.01)
(Continued)

(52) U.S. Cl.
CPC .......... *H01L 51/5008* (2013.01); *H01L 51/524* (2013.01); *H01L 51/5221* (2013.01); *H01L 51/5253* (2013.01); *H01L 27/3211* (2013.01); *H01L 2251/5315* (2013.01); *H01L 2251/558* (2013.01)

(58) Field of Classification Search
CPC ............ H01L 51/5008; H01L 51/5221; H01L 51/524; H01L 51/5253; H01L 27/3211
See application file for complete search history.

(56) References Cited

U.S. PATENT DOCUMENTS 6,730,416 B1 * 5/2004 Chondroudis ......... B82Y 10/00
                                                    313/504
7,452,738 B2   11/2008 Hayashi et al.
(Continued)

FOREIGN PATENT DOCUMENTS

JP    09-283281     10/1997
JP    2003-142274    5/2003
(Continued)

OTHER PUBLICATIONS

International Search Report (ISR) in International Patent Application No. PCT/JP2013/003743, dated Sep. 24, 2013.

*Primary Examiner* — Nicholas Tobergte
(74) *Attorney, Agent, or Firm* — Greenblum & Bernstein, P.L.C.

(57) ABSTRACT

An organic EL display device comprising: an anode; a cathode that is a metal film; a light-emitting layer between the anode and the cathode; and a sealing layer that covers a side of the cathode opposite a side on which the light-emitting layer is provided. An oxidation inhibiting layer and a cathode protecting layer are stacked between the cathode and the sealing layer. The oxidation inhibiting layer is closer to the light-emitting layer than the cathode protecting layer is.

10 Claims, 16 Drawing Sheets

(51) Int. Cl.
*H01L 51/52* (2006.01)
*H01L 27/32* (2006.01)

(56) References Cited

U.S. PATENT DOCUMENTS

| | | | |
|---|---|---|---|
| 7,667,284 B2 | 2/2010 | Hayashi et al. | |
| 7,956,355 B2 | 6/2011 | Hayashi et al. | |
| 8,435,671 B2 * | 5/2013 | Zaghib | H01M 4/0404 204/242 |
| 8,587,003 B2 | 11/2013 | Ando | |
| 8,883,532 B2 | 11/2014 | Ando | |
| 2006/0088951 A1 | 4/2006 | Hayashi et al. | |
| 2009/0050883 A1 | 2/2009 | Hayashi et al. | |
| 2010/0171147 A1 | 7/2010 | Hayashi et al. | |
| 2010/0253215 A1 * | 10/2010 | Fukagawa | H01L 51/5237 313/504 |
| 2012/0097933 A1 | 4/2012 | Ando | |
| 2013/0033173 A1 | 2/2013 | Yamauchi | |
| 2013/0171756 A1 | 7/2013 | Ando | |
| 2014/0203271 A1 | 7/2014 | Yoneda et al. | |
| 2015/0069349 A1 | 3/2015 | Hayashi et al. | |

FOREIGN PATENT DOCUMENTS

| | | |
|---|---|---|
| JP | 2007-095428 | 4/2007 |
| JP | 2010-257957 | 11/2010 |
| JP | 2011-146307 | 7/2011 |
| JP | 2011-192660 | 9/2011 |
| JP | 2012-079631 | 4/2012 |

* cited by examiner

ORGANIC EL DISPLAY DEVICE AND METHOD FOR MANUFACTURING SAME

TECHNICAL FIELD

A technique disclosed here relates to an organic electroluminescence (EL) display device and a method of manufacturing the organic EL display device.

BACKGROUND ART

An organic EL display device uses a thin-film transistor (TFT) to control a light-emission state on a per subpixel basis. Each subpixel includes one of a red-light-emitting layer, a green-light-emitting layer, and a blue-light-emitting layer. The red-light-emitting layer, the green-light-emitting layer, and the blue-light-emitting layer are formed using, for example, a coating method or a vapor deposition method (see patent literature (PTL) 1, for example).

CITATION LIST

Patent Literature

[PTL 1]
Japanese Unexamined Patent Application Publication No. 2012-79631

SUMMARY OF INVENTION

Technical Problem

When an organic EL display device of a top-emission type that emits light from a cathode side includes, as a cathode, an aluminum thin-film that is a metal film that transmits visible light, the performance as the cathode may deteriorate due to oxidation of the aluminum thin-film. Specifically, the organic EL display device has an increased drive voltage, a decreased luminance half life, or the like, which is problematic.

Solution to Problem

An aspect of an organic EL display device which solves the above-described problem includes: an anode; a cathode that is a metal film; a light-emitting layer between the anode and the cathode; and a sealing layer that covers a side of the cathode opposite a side on which the light-emitting layer is provided, wherein an oxidation inhibiting layer and a cathode protecting layer are stacked between the cathode and the sealing layer, the oxidation inhibiting layer being closer to the light-emitting layer than the cathode protecting layer is.

Furthermore, an aspect of a method for manufacturing an organic EL display device which solves the above-described problem includes: forming an anode; forming a light-emitting layer above the anode; forming a cathode above the light-emitting layer, the cathode being a metal film; forming an oxidation inhibiting layer above the cathode, the cathode and the oxidation inhibiting layer being sequentially formed in a vacuum; forming a cathode protecting layer above the oxidation inhibiting layer; and forming a sealing layer above the cathode.

Advantageous Effects of Invention

An increase in a drive voltage and decrease in a luminance half life of an organic EL display device can be reduced.

DESCRIPTION OF EMBODIMENT

Figure 1:
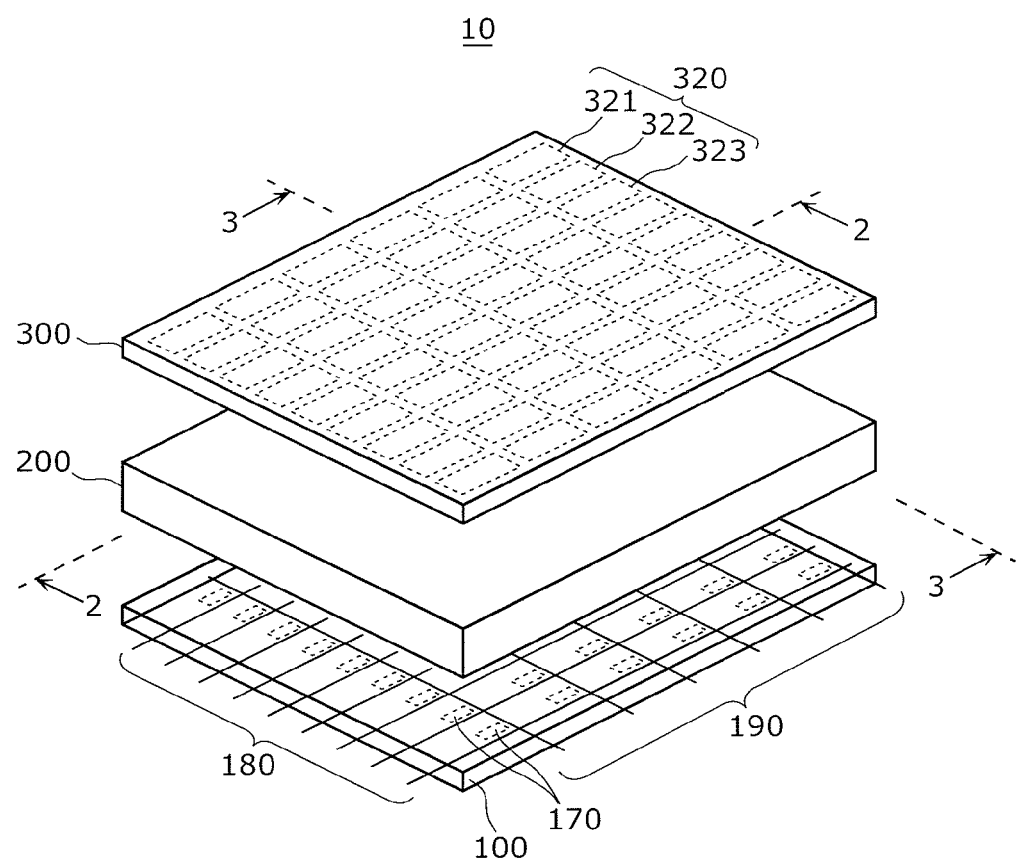
FIG. 1 is an exploded perspective view showing a schematic configuration of an organic EL display device.

The following describes an organic EL display device and a method of manufacturing the organic EL display device according to an embodiment, with reference to drawings. Note that, each of the embodiments described below illustrates a preferred specific example of the present invention. Thus, the numerical values, shapes, materials, structural elements, the arrangement and connection of the structural elements, manufacturing steps (steps), the processing order of the steps etc. shown in the following embodiments are mere examples and are not intended to limit the present invention. Therefore, among the structural elements in the following embodiment, those structural elements which are not described in the independent claims indicating the broadest concept of the present invention are described as arbitrary structural elements.

Note that, the Drawings are schematic diagrams, and illustration is not necessarily strictly accurate. Furthermore, in the Drawings, structural elements having substantially the same configuration are given the same reference sign, and redundant description thereof shall be omitted.

[1. Configuration of Organic EL Display Device 10]

Figure 2:
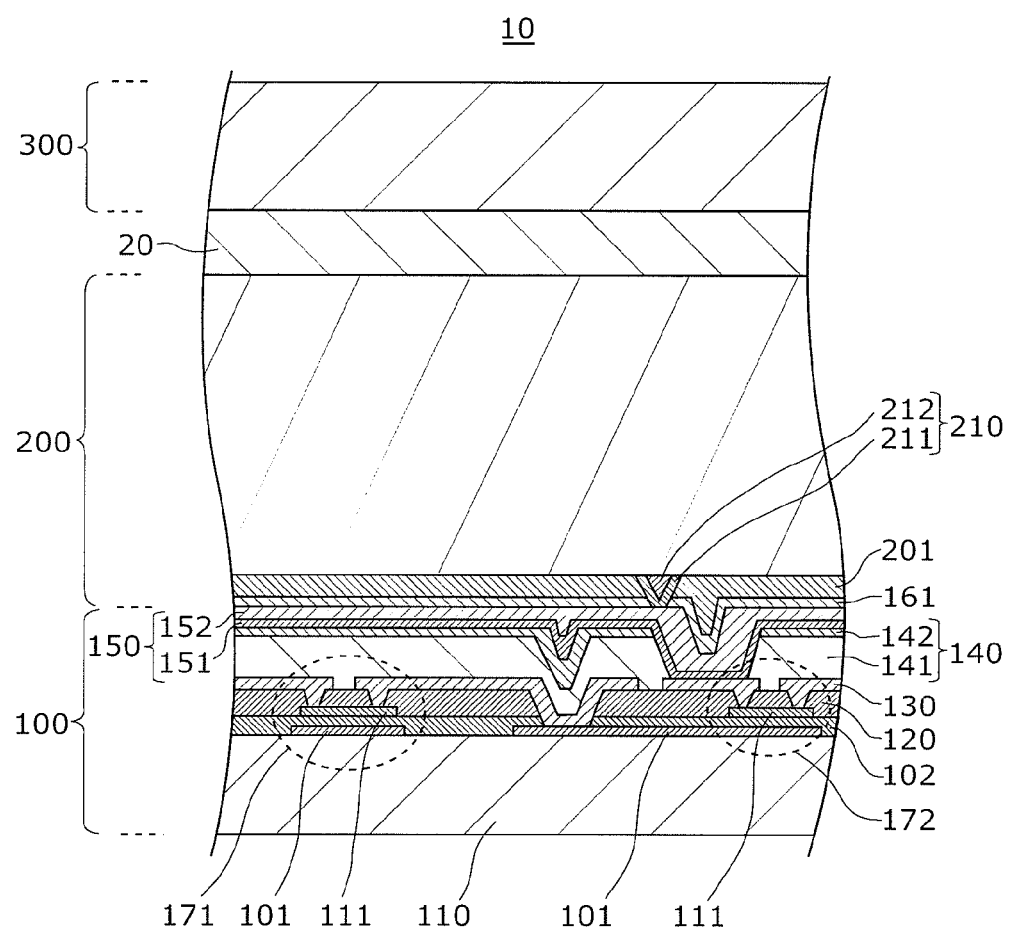
FIG. 2 is a diagram showing a part of a cross section taken along a line 2-2 in FIG. 1.
Figure 3:
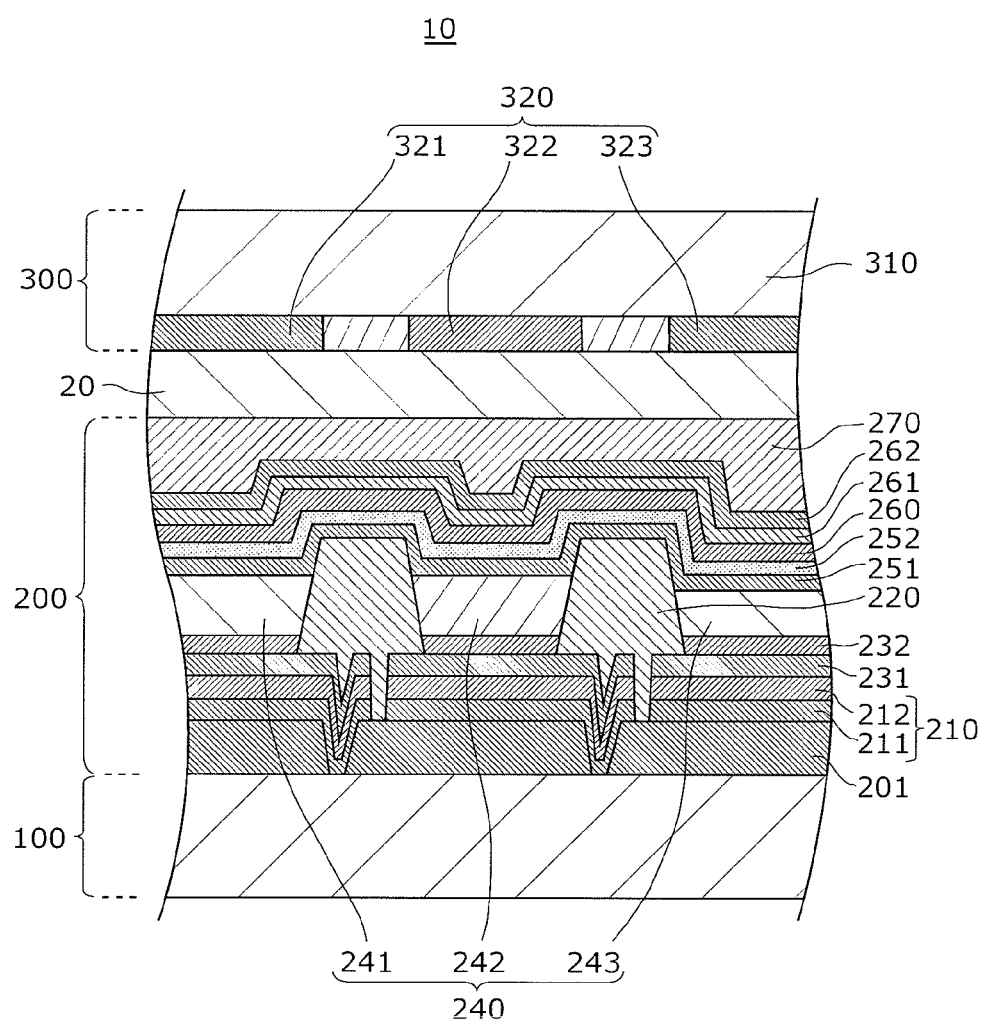
FIG. 3 is a diagram showing a part of a cross section taken along a line 3-3 in FIG. 1.

As illustrated in FIG. 1 to FIG. 3, an organic EL display device 10 disclosed here has a configuration in which a TFT substrate 100, an EL device unit 200, and a color filter substrate 300 are stacked. The EL device unit 200 and the color filter substrate 300 are attached via an attaching layer 20.

Note that, in FIG. 2, details of configurations of the EL device unit 200 and the color filter substrate are omitted where appropriate. In FIG. 3, details of configuration of the TFT substrate 100 are omitted where appropriate.

As illustrated in FIG. 1, the TFT substrate 100 includes a plurality of TFT units 170. As described later, each of the TFT units 170 includes at least two TFTs. The TFT units 170 are disposed in a matrix. Furthermore, signals are provided to the TFT units 170 through a gate line 180 and a source line 190.

As illustrated in FIG. 3, the EL device unit 200 includes a light-emitting layer 240. The light-emitting layer 240 emits light through recombination of a hole injected from an anode 210 and an electron injected from a cathode 260.

As illustrated in FIG. 1 and FIG. 3, the color filter substrate 300 includes a filter 320 provided on a glass substrate 310. The filter 320 includes a red filter 321, a green filter 322, and a blue filter 323. The red filter 321 transmits red light emitted from the EL device unit 200. The green filter 322 transmits green light emitted from the EL device unit 200. The blue filter 323 transmits blue light emitted from the EL device unit 200. Specifically, the disclosed organic EL display device 10 is of a top-emission type.

An organic EL display device of a bottom-emission type emits light from a TFT substrate side. In contrast, in the case of a top-emission type, a TFT substrate is not formed in a direction light is emitted. Thus, the top-emission type can provide a higher aperture ratio compared with the bottom-emission type. In other words, the top-emission type has even greater light-emission efficiency.

[1-1. Configuration of TFT Substrate 100]

As illustrated in FIG. 1 and FIG. 2, the TFT substrate 100 includes a plurality of the TFT units 170 on a glass substrate 110. Each of the TFT units 170 includes a switching TFT 171 and a drive TFT 172. The switching TFT 171 switches the drive TFT 172 between on and off. The drive TFT 172 controls a current supplied to the EL device unit 200.

A gate electrode 101 is connected to the gate line 180. A first electrode 130 is connected to the source line 190.

When a gate signal is inputted to the gate line 180, the switching TFT 171 turns to an on-state. Then, an electric charge supplied through the source line 190 is accumulated in a capacitor (not illustrated). Conductance of the drive TFT 172 continuously changes due to the electric charge accumulated in the capacitor (not illustrated). Thus, a driving current which causes the EL device unit 200 to emit light can be passed to the EL device unit 200 to provide a desired luminance.

The TFT unit 170 disclosed here is of a bottom-gate type. The gate electrode 101 has, for example, a configuration in which a copper (Cu) film is stacked on a molybdenum (Mo) film provided on the glass substrate 110. The gate electrode 101 is covered by a gate insulating film (gate oxide film) 102.

The gate insulating film 102 has, for example, a configuration in which a silicon dioxide ($SiO_2$) is stacked on a silicon nitride (SiN). A portion of the gate insulating film 102 is opened to communicate a signal to the gate electrode 101 of the drive TFT 172.

A semiconductor layer 111 is provided on the gate insulating film 102. For example, a transparent amorphous oxide semiconductor (TAOS), amorphous silicon, or the like is used for the semiconductor layer 111. An example of a TAOS material is an amorphous-indium gallium zinc oxide (a-InGaZnO$_4$). Note that a silicon semiconductor may be used as the semiconductor layer 111.

The semiconductor layer 111 is covered by a first insulating layer 120. An example of the first insulating layer 120 is $SiO_2$. A portion of the first insulating layer 120 is opened. The first electrode 130 is connected to the semiconductor layer 111 via the opened portion. In FIG. 2, facing the drawing, the first electrode 130 connected to a right side (drain side) of the switching TFT 171 is connected to the gate electrode 101 of the drive TFT 172. For example, Cu is used for the first electrode 130.

The first electrode 130 is covered by a protective layer 140. The protective layer 140 has a stacked structure of a first protective layer 141 and a second protective layer 142. For example, a $SiO_2$ is used for the first protective layer 141. For example, a SiN is used for the second protective layer 142. A portion of the protective layer 140 is opened to obtain a signal from the drive TFT 172.

A second electrode 150 is provided on the protective layer 140. The second electrode 150 has, for example, a stacked structure of a lower layer electrode 151 and an upper layer electrode 152. In FIG. 2, facing the drawing, the second electrode 150 is connected to the first electrode 130 that is on the left side (source side) of the drive TFT 172. For example, an indium tin oxide (ITO) is used for the lower layer electrode 151. For example, Cu is used for the upper layer electrode 152.

The second electrode 150 is covered by a second insulating layer 161. A portion of the second insulating layer 161 is opened.

[1-2. Configuration of EL Device Unit 200]

[1-2-1. Planarizing Layer 201]

As illustrated in FIG. 3, the EL device unit 200 is connected to the TFT substrate 100 through an opened portion of a planarizing layer 201. Specifically, the anode 210 including an upper layer anode 212 and a lower layer anode 211 is connected to the TFT substrate 100. The planarizing layer 201 is provided on the TFT substrate 100. In other words, the planarizing layer 201 reduces an unevenness created on the TFT substrate 100. For example, a resin is used for the planarizing layer 201.

[1-2-2. Anode 210]

The anode 210 covers the planarizing layer 201. The opened portion of the planarizing layer 201 is filled by a portion of the anode 210. The anode 210 has, for example, a stacked structure of the lower layer anode 211 and the upper layer anode 212. For example, an aluminum alloy is used for the lower layer anode 211. For example, an indium zinc oxide (IZO) is used for the upper layer anode 212. The anode 210 reflects light emitted from the light-emitting layer 240. This is for achieving even higher light-emission efficiency in the organic EL display device of a top-emission type.

[1-2-3. Hole Injection Layer 231]

A hole injection layer 231 covers the anode 210. The hole injection layer 231 injects a hole to the light-emitting layer 240. An ionization energy of the hole injection layer 231 is selected to be between a work function of the anode 210 and an ionization energy of the light-emitting layer 240. For example, the hole injection layer 231 is made from (i) an organic material of phthalocyanine, oligoamine, dendrimer amine, polythiophene series, or the like or (ii) an inorganic material, such as a metal oxide, or the like. For example, a tungsten oxide film is used for the hole injection layer 231.

[1-2-4. Electron Blocking Layer 232]

An electron blocking layer 232 covers the hole injection layer 231. The electron blocking layer 232 reduces chances where an electron injected from an electron injection layer 251, which will be described later, reaches the hole injection layer 231. An ionization energy of the electron blocking layer 232 is greater than an ionization energy of the light-emitting layer 240. For example, a polymeric material is used for the electron blocking layer 232.

[1-2-5. Light-emitting Layer 240]

The light-emitting layer 240 includes, for example, a red-light-emitting layer 241 which emits red light, a green-light-emitting layer 242 which emits green light, and a blue-light-emitting layer 243 which emits blue light. As illustrated in FIG. 3, the red-light-emitting layer 241, the green-light-emitting layer 242, and the blue-light-emitting layer 243 are separately provided in one of the regions partitioned by banks 220. The light-emitting layer 240 is positioned between the electron blocking layer 232 and the electron injection layer 251 which will be described later.

For the light-emitting layer 240, both a small molecule material and a polymeric material can be used. The small molecule material and the polymeric material are not necessarily strictly differentiated. Typically, a material which has a unit of repetition of a molecular structure, and has a large molecular weight is called a polymeric material. A polymeric material generally has a molecular weight larger than or equal to 10,000. The polymeric material has a molecular-weight distribution. A small molecule material usually does not have a molecular-weight distribution.

The light-emitting layer 240 is a layer where an electron and a hole recombine. The light-emitting layer 240 includes a host and a dopant which functions as a center of light-emission when an electron and a hole recombine.

The host is, for example, of anthracene, amine, diamine, styryl, silole, azole, polyphenyl series, or the like.

An example of the anthracene series is a diphenylanthracene derivative, a diphenylanthracene derivative dimer, or the like. An example of the diamine series is bis carbazole, or the like. An example of the styryl series is a distyrylarylene, a styrylamine, or the like. The silole series is a material including a 5-membered ring containing silicon (Si). In other words, the silole series is one type of an electron-deficient ring. An example of the azole series is oxazole, oxadiazole, benzimidazole, or the like. An example of the polyphenyl series is terphenyl, quaterphenyl, quinquephenyl, sexiphenyl, or the like.

For the dopant, a material having an energy gap less than an energy gap of the host is selected. The dopant is usually added to be approximately 0.5 mol % to 5 mol % concentration. The amount of dopant to add is adjusted to reduce an effect of concentration quenching. In the light-emitting layer 240, the dopant becomes the center of light-emission. Thus, typically, the light-emitting layer 240 has the same EL spectrum as photoluminescence of the dopant.

An example of a dopant having a red center of light-emission is of cyano-methylene-pyran, dicyano, phenoxazone, thioxanthene series, or the like.

An example of a dopant having a blue center of light-emission is of styryl series, a fused polycyclic aromatic ring system, or the like.

An example of a dopant having a green center of light-emission is of coumarin, or quinacridone series, or the like.

[1-2-6. Electron Injection Layer 251]

The electron injection layer 251 covers the light-emitting layer 240 and the bank 220. The electron injection layer 251 injects an electron to the light-emitting layer 240. An electron affinity of the electron injection layer 251 is selected to be between a work function of the cathode 260 which will be described later and an electron affinity of the light-emitting layer 240. For example, the electron injection layer 251 is made from (i) an organic material of metal chelate, phenanthroline, oxadiazole, or triazole series, or the like or (ii) an inorganic material, such as an alkali metal compound, an alkaline earth metal compound, or the like.

[1-2-7. Cathode 260, Oxidation Inhibiting Layer 261, and Cathode Protecting Layer 262]

The cathode 260 is formed to cover an electron injection layer 251. In an organic EL display device of a top-emission type, it is desired that an electrode on a display side (namely, the cathode 260) has an increased visible light transmission factor.

It should be noted that a mixture layer 252 may be formed at an interface between the electron injection layer 251 and the cathode 260. The mixture layer is a layer in which a material included in the electron injection layer 251 and a material included in the cathode 260 are mixed.

Furthermore, an oxidation inhibiting layer 261 and a cathode protecting layer 262 are provided on the cathode 260.

The cathode 260, the oxidation inhibiting layer 261, and the cathode protecting layer 262 will be described later in detail.

[1-2-8. Sealing Layer 270]

A sealing layer 270 covers a side of the cathode 260 opposite a side on which the light-emitting layer 240 is provided. Specifically, the sealing layer 270 is formed on the cathode protecting layer 262 to cover the cathode 260.

In the case of an EL device unit not sealed by a sealing layer 270, moisture in the environment or moisture from cleaning is more likely to enter inside the EL device unit. The water entered inside may cause detachment of a layer or the like. Consequently, a failure becomes more likely to occur, such as a failure to provide normal light emission. Thus, it is preferable to provide the sealing layer 270.

The sealing layer 270 is made from an organic material, such as poly-para-xylene, fluoride resin, or the like, an oxide material, such as $SiO_2$, an germanium oxide (GeO), an aluminum oxide ($Al_2O_3$), or the like, or a nitride material, such as a silicon oxynitride (SiON), a SiN, or the like. Note that, the sealing layer 270 may have a configuration in which layers of materials of a plurality of types are stacked. For example, a SiN is used in the EL device unit 200 disclosed here.

[1-3. Color Filter Substrate 300]

The color filter substrate 300 changes a color of emitted light by absorption of light. In other words, color purity improves as light passes through the color filter substrate 300. The filter 320 adjusts a wavelength of transmitted light with a pigment or the like.

[2. Manufacturing Method of Organic EL Display Device 10]

Figure 4:
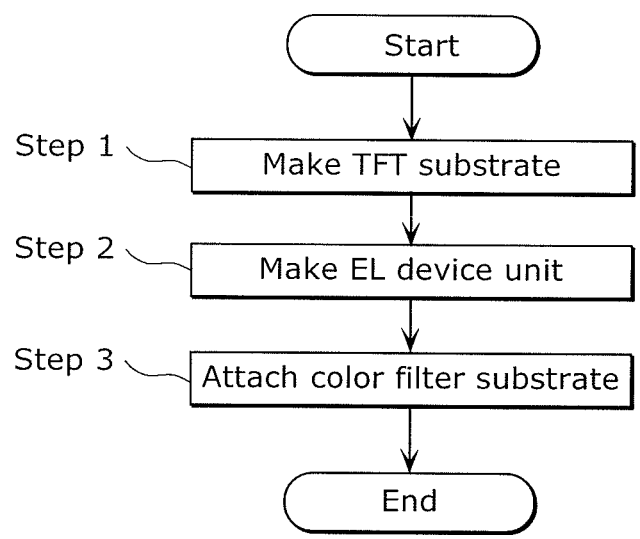
FIG. 4 is a manufacturing flow diagram of the organic EL display device.

As illustrated in FIG. 4, a method of manufacturing the organic EL display device 10 includes: a manufacturing step (step 1) of making the TFT substrate 100, a manufacturing step (step 2) of making the EL device unit 200; and a manufacturing step (step 3) of attaching the color filter substrate 300.

Details of the manufacturing step (step 1) of making the TFT substrate 100 and the manufacturing step (step 2) of making the EL device unit 200 will be described later as a manufacturing method of the TFT substrate 100 and a manufacturing method of the EL device unit 200.

In the manufacturing step (step 3) of attaching the color filter substrate 300, as illustrated in FIG. 3, the EL device unit 200 and the color filter substrate 300 are attached via the attaching layer 20. The color filter substrate 300 used in step 3 is made according to a color filter substrate 300 manufacturing method which will be described later. For the attaching layer 20, a UV-curable resin is used, for example. The attaching layer 20 has a film thickness of approximately 10 μm to 30 μm.

As described earlier, the TFT substrate 100 is covered by the planarizing layer 201 that includes the opened portion. Thus, after only the EL device unit 200 is separately made, it is not easy to attach the EL device unit 200 and the TFT substrate 100. On the other hand, after the color filter substrate 300 is separately made, it is easy to attach the color filter substrate 300 and the EL device unit 200.

[2-1. Manufacturing Method (step 1) of TFT Substrate 100]

Figure 5:
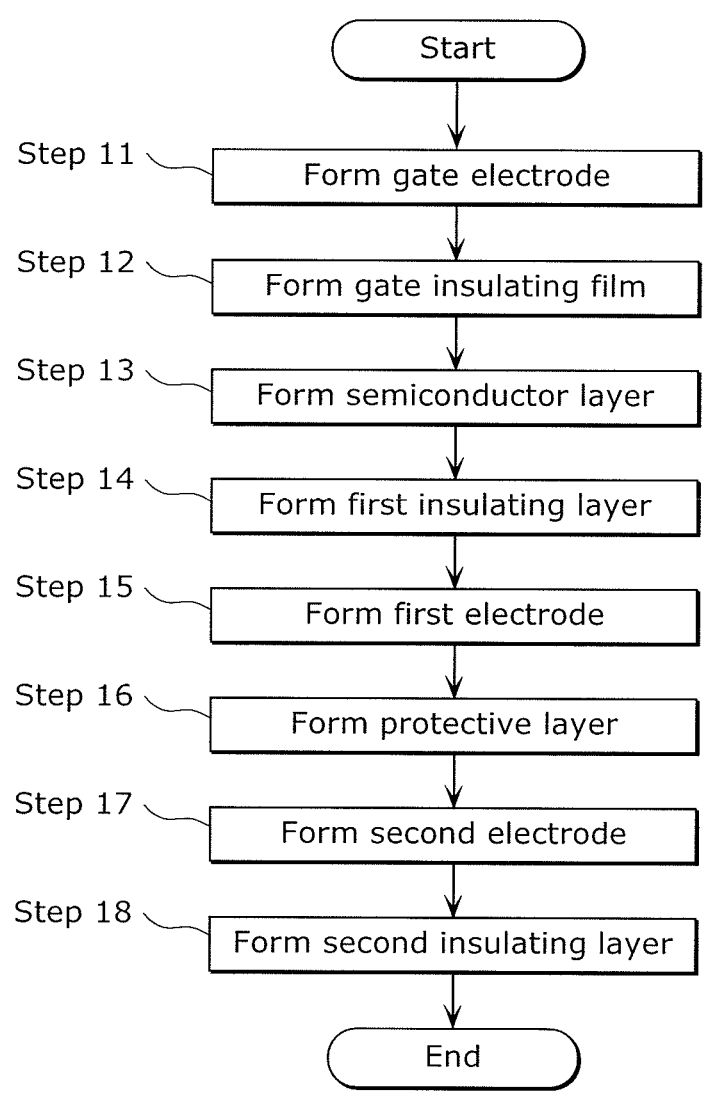
FIG. 5 is a manufacturing flow diagram of a TFT substrate.

As illustrated in FIG. 5, a method of manufacturing the TFT substrate 100 includes, for example: a manufacturing step (step 11) of forming the gate electrode 101; a manufacturing step (step 12) of forming the gate insulating film 102; a manufacturing step (step 13) of forming the semiconductor layer 111; a manufacturing step (step 14) of forming the first insulating layer 120; a manufacturing step (step 15) of forming the first electrode 130; a manufacturing step (step 16) of forming the protective layer 140; a manufacturing step (step 17) of forming the second electrode 150; and a manufacturing step (step 18) of forming the second insulating layer 161.

The TFT substrate 100 disclosed here is made with the processes from step 11 to step 18 as described.

[2-1-1. Step 11]

Figure 6:
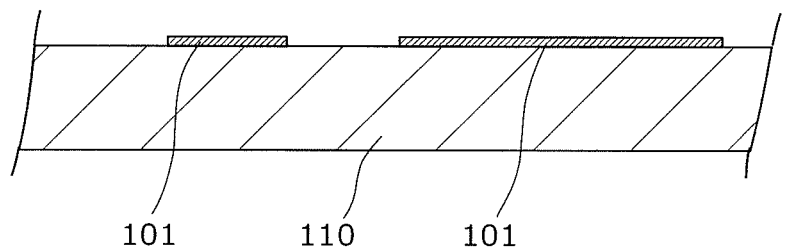
FIG. 6 is a schematic cross-sectional view after a formation of a gate electrode in a manufacturing process of the TFT substrate.

As illustrated in FIG. 6, in step 11, the gate electrode 101 is formed on the glass substrate 110. For example, a Mo film and a Cu film are sequentially deposited on the glass substrate 110 using a sputtering method. A summed film thickness of the Mo film and the Cu film is approximately 50 nm to 150 nm.

Next, the gate electrode 101 having a predetermined pattern is formed by photolithography and etching using a resist.

[2-1-2. Step 12]

Figure 7:
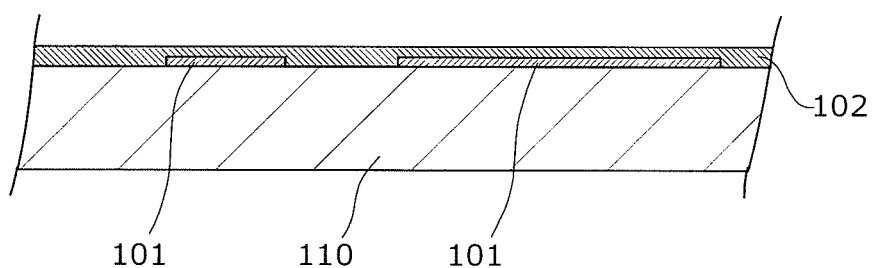
FIG. 7 is a schematic cross-sectional view after a formation of a gate insulating film in the manufacturing process of the TFT substrate.

As illustrated in FIG. 7, in step 12, the gate insulating film 102 is formed which covers the gate electrode 101. For example, a $SiO_2$ film having a film thickness of approximately 100 nm to 300 nm is formed by a parallel-plate type plasma chemical vapor deposition (CVD). The material includes, for example, $SiH_4$ and $N_2O$. Plasma is generated, for example, with application of high frequency of 13.56 MHz. The $SiH_4$ and $N_2O$ are decomposed in plasma, and $SiO_2$ cluster is created. $SiO_2$ is deposited on the glass substrate 110 due to self-bias generated in plasma.

[2-1-3. Step 13]

Figure 8:
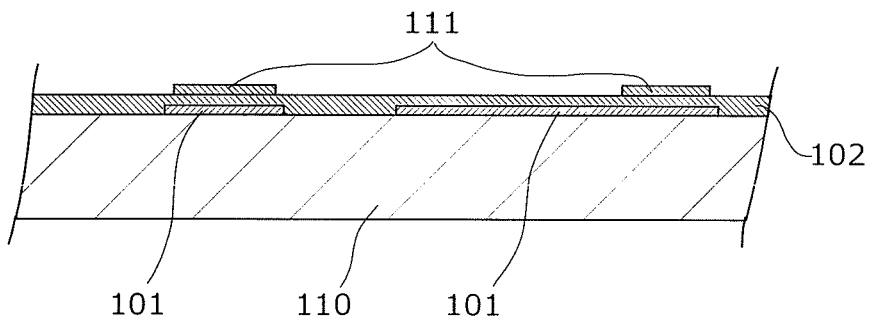
FIG. 8 is a schematic cross-sectional view after a formation of a semiconductor layer in the manufacturing process of the TFT substrate.

As illustrated in FIG. 8, in step 13, the semiconductor layer 111 is formed on the gate insulating film 102. When a TAOS is used as the semiconductor layer 111, a sputtering method is used, for example. For example, a target material in which a composition ratio of In:Ga:Zn is 1:1:1 is used. The target material is sputtered in an oxygen atmosphere. With this, a film of a-InGaZnO$_4$ is formed. The film thickness is, for example, approximately 30 nm to 150 nm. Furthermore, when heat treatment at approximately 200 degrees Celsius to 500 degrees Celsius is performed in air, a property of TFT improves.

When amorphous silicon is used as the semiconductor layer 111, a plasma CVD method is used, for example. For example, when monosilane is used for a material, the monosilane is decomposed into silicon and hydrogen in plasma. The silicon is deposited in an amorphous state on the gate insulating film 102. The film thickness is approximately 30 nm to 150 nm, for example.

Next, the semiconductor layer 111 having a predetermined pattern is formed by photolithography and etching using a resist.

[2-1-4. Step 14]

Figure 9:
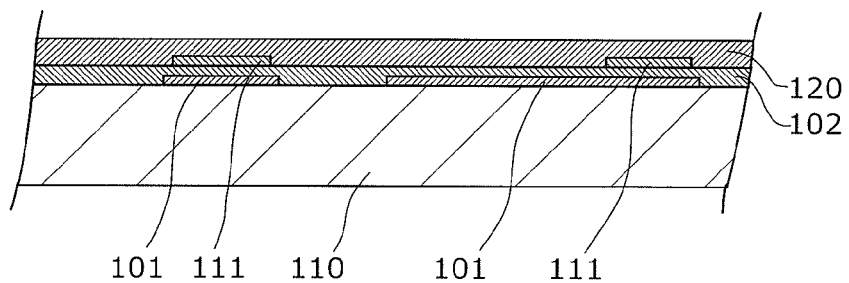
FIG. 9 is a schematic cross-sectional view after a formation of a first insulating layer in the manufacturing process of the TFT substrate.

As illustrated in FIG. 9, in step 14, the first insulating layer 120 is formed on the gate insulating film 102 and the semiconductor layer 111. For example, an $SiO_2$ film is formed to have a film thickness of approximately 100 nm to 300 nm by parallel-plate type plasma CVD. The material includes $SiH_4$ and $N_2O$, for example.

[2-1-5. Step 15]

Figure 10:
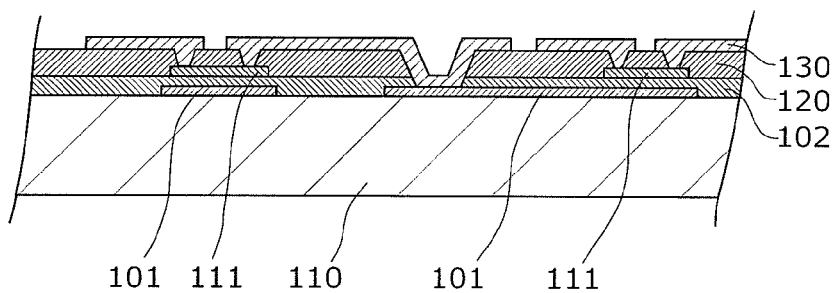
FIG. 10 is a schematic cross-sectional view after a formation of a first electrode in the manufacturing process of the TFT substrate.

As illustrated in FIG. 10, in step 15, the first electrode 130 is formed. The first electrode 130 contacts the gate electrode 101 and a source/a drain in the semiconductor layer 111. First, a predetermined area of the first insulating layer 120 is opened by photolithography and etching. Next, a Cu film is deposited by sputtering. The Cu film has a film thickness of approximately 100 nm to 300 nm, for example. Next, the Cu film is processed into a predetermined pattern by photolithography and etching. The first electrode 130 is formed as described above. The aforementioned first insulating layer 120 has a function of insulating the semiconductor layer 111 and the first electrode 130.

[2-1-6. Step 16]

Figure 11:
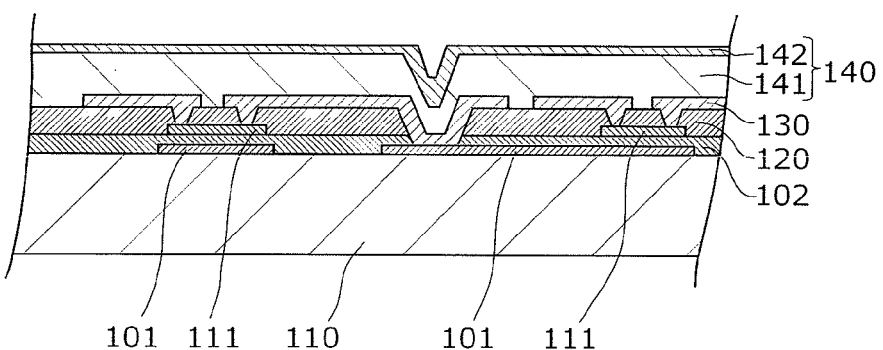
FIG. 11 is a schematic cross-sectional view after a formation of a protective layer in the manufacturing process of the TFT substrate.

As illustrated in FIG. 11, in step 16, the protective layer 140 is formed. The protective layer 140 disclosed here has, for example, a stacked structure of the first protective layer 141 and the second protective layer 142. As the first protective layer 141, a $SiO_2$ film having a film thickness of approximately 100 nm to 400 nm is formed by parallel-plate type plasma CVD, for example. The material includes, for example, $SiH_4$ and $N_2O$.

As the second protective layer 142, a SiN film having a film thickness of approximately 50 nm to 200 nm is formed by parallel-plate type plasma CVD, for example. The material includes, for example, $SiH_4$ and ammonia ($NH_3$).

[2-1-7. Step 17]

Figure 12:
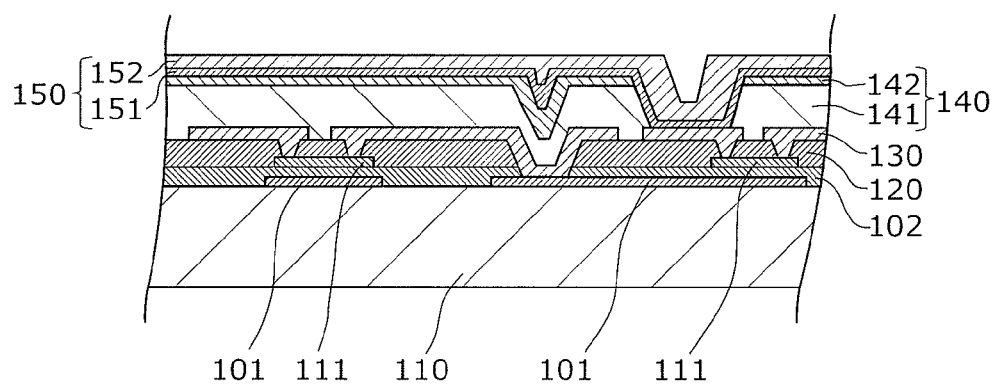
FIG. 12 is a schematic cross-sectional view after a formation of a second electrode in the manufacturing process of the TFT substrate.

As illustrated in FIG. 12, in step 17, the second electrode 150 is formed. The second electrode 150 has, for example, a stacked structure of the lower layer electrode 151 and the upper layer electrode 152. The second electrode 150 contacts the first electrode 130. First, a predetermined region of the protective layer 140 is opened by photolithography and etching.

Next, an ITO film is deposited by sputtering. The ITO film has a film thickness of, for example, approximately 50 nm to 150 nm. Next, a Cu film is deposited by sputtering. The Cu film has a film thickness of, for example, approximately 100 nm to 400 nm.

Next, the ITO film and the Cu film are processed into predetermined patterns by photolithography and etching. As described above, the lower layer electrode 151 that is ITO and the upper layer electrode 152 that is Cu are formed.

[2-1-8. Step 18]

Figure 13:
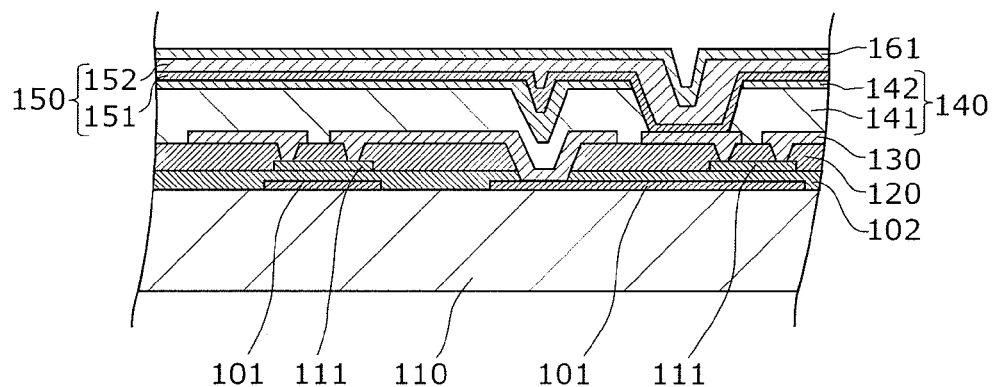
FIG. 13 is a schematic cross-sectional view after a formation of a second insulating layer in the manufacturing process of the TFT substrate.

As illustrated in FIG. 13, in step 18, the second insulating layer 161 is formed. As the second insulating layer 161, a SiN film having a film thickness of approximately 50 nm to 200 nm is formed by parallel-plate type plasma CVD, for example. The material includes, for example, $SiH_4$ and ammonia.

With the step 11 to step 18 described above, the TFT substrate 100 is made.

[2-2. Manufacturing method of EL device unit 200 (step 2)]

Figure 14:
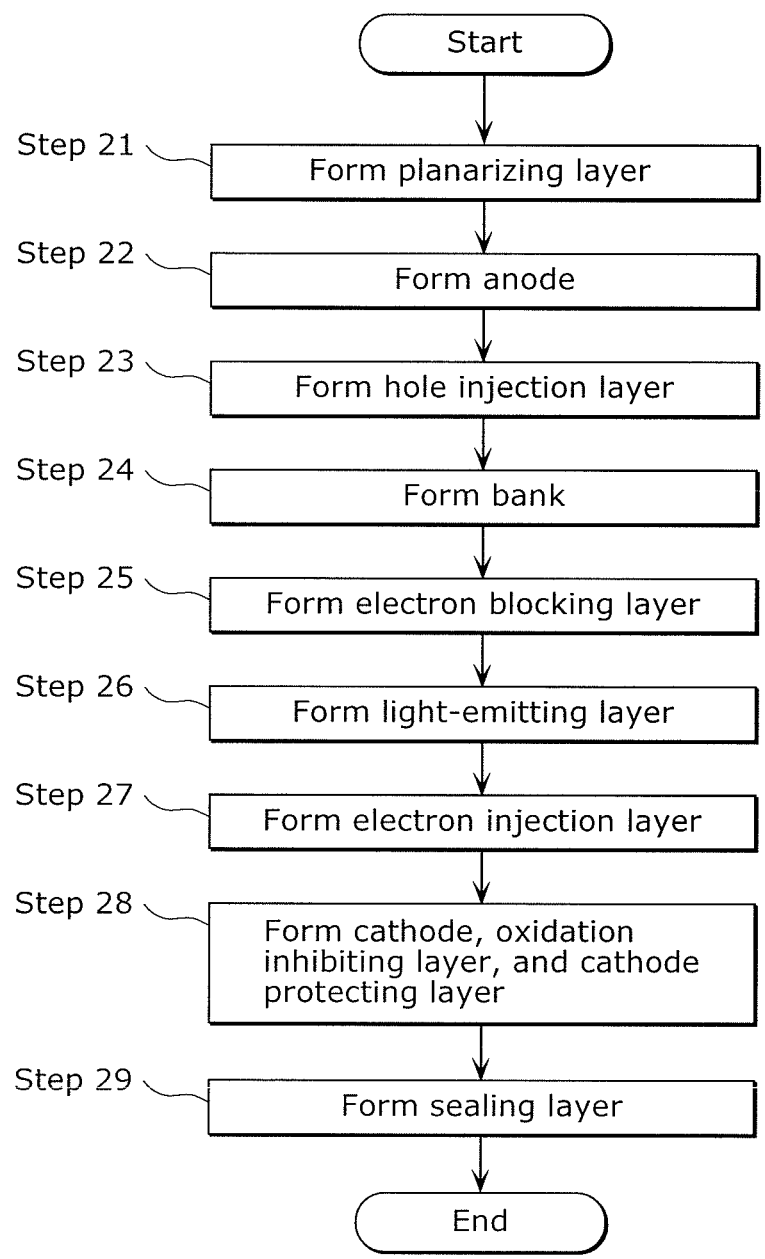
FIG. 14 is a manufacturing flow diagram of an EL device unit.

As illustrated in FIG. 14, for example, a method of manufacturing the EL device unit 200 includes: a manufacturing step (step 21) of forming the planarizing layer 201; a manufacturing step (step 22) of forming the anode 210; a manufacturing step (step 23) of forming the hole injection layer 231; a manufacturing step (step 24) of forming the bank 220; a manufacturing step (step 25) of forming the electron blocking layer 232; a manufacturing step (step 26) of forming the light-emitting layer 240; a manufacturing step (step 27) of forming the electron injection layer 251; a manufacturing step (step 28) of forming the cathode 260, the oxidation inhibiting layer 261, and the cathode protecting layer 262; and a manufacturing step (step 29) of forming the sealing layer 270.

The EL device unit 200 disclosed here is made with processes of step 21 to step 29.

[2-2-1. Step 21]

Figure 15:
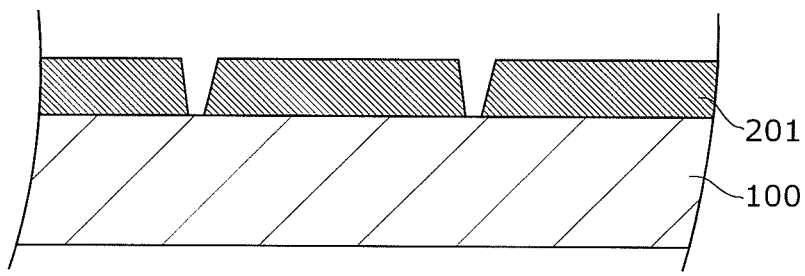
FIG. 15 is a schematic cross-sectional view after a formation of a planarizing layer in a manufacturing process of the EL device unit.

As illustrated in FIG. 15, in step 21, the planarizing layer 201 is formed. For example, a photosensitive resin is used as the planarizing layer 201. Specifically, for example, a resin composition containing an acrylate compound that includes a radical reactive unsaturated compound, a resin composition containing a mercapto compound that includes an acrylate compound and a thiol group, or a resin composition in which multifunctional acrylate monomer, such as epoxy acrylate, urethane acrylate, polyester acrylate, polyether acrylate, polyethylene glycol acrylate, glycerol methacrylate, or the like, is dissolved is used. Furthermore, an arbitrary mixture of the above-described resin compositions can also be used. Note that, the photosensitive resin is not particularly limited as long as a reactive monomer that includes in a molecule at least one photopolymerizable unsaturated bond is contained. The photosensitive resin is dispersed in a solvent.

First, for example, a photosensitive resin is formed on the TFT substrate 100 using an application method. A surface on which the photosensitive resin is applied is a surface on which the second insulating layer 161 is provided. Next, photolithography and development are performed. This is for forming an opening for connection to the TFT substrate 100. Next, heat treatment is performed in an air. A temperature of the heat treatment is approximately 150 degrees Celsius to 250 degrees Celsius. A remaining solvent volatilizes due to the heat treatment. The planarizing layer 201 after the heat treatment has a film thickness of approximately 2 μm to 5 μm. Next, the second insulating layer 161 is etched using the planarizing layer 201 as a mask. This is for exposing a surface of the second electrode 150.

[2-2-2. Step 22]

Figure 16:
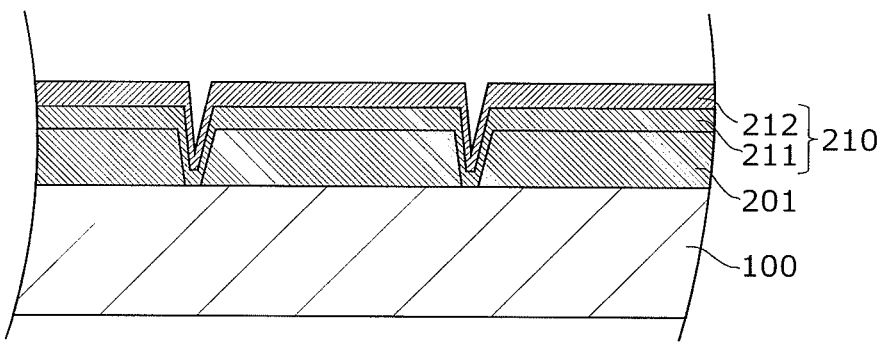
FIG. 16 is a schematic cross-sectional view after a formation of a reflective anode in the manufacturing process of the EL device unit.

As illustrated in FIG. 16, in step 22, the anode 210 is formed. The anode 210 has, for example, a stacked structure of the lower layer anode 211 and the upper layer anode 212. For example, an aluminum alloy is used for the lower layer anode 211. For example, an IZO is used for the upper layer anode 212. The lower layer anode 211 and the upper layer anode 212 are formed, for example, by sputtering. The lower layer anode 211 has a film thickness of, for example, approximately 100 nm to 500 nm. The upper layer anode 212 has a film thickness of, for example, approximately 5 nm to 30 nm.

[2-2-3. Step 23]

Figure 17:
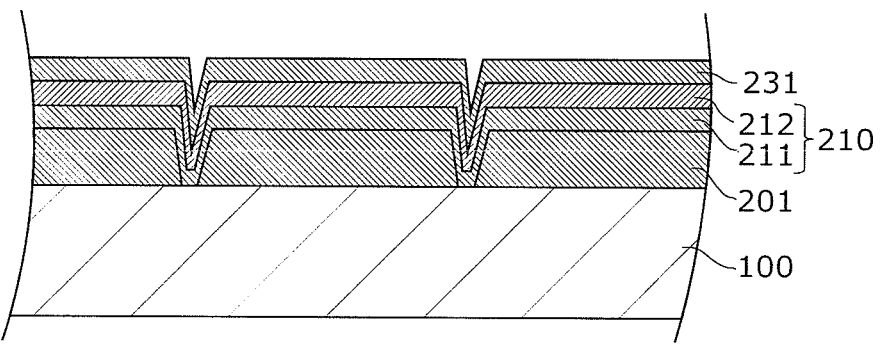
FIG. 17 is a schematic cross-sectional view after a formation of a hole injection layer in the manufacturing process of the EL device unit.

As illustrated in FIG. 17, in step 23, the hole injection layer 231 is formed. For example, a tungsten oxide film is used for the hole injection layer 231. The hole injection layer 231 is formed, for example, by sputtering. The composition of the tungsten oxide is expressed as WOx ($2 \leq x \leq 3$). The hole injection layer 231 has a film thickness of, for example, approximately 2 nm to 20 nm.

[2-2-4. Step 24]

Figure 18:
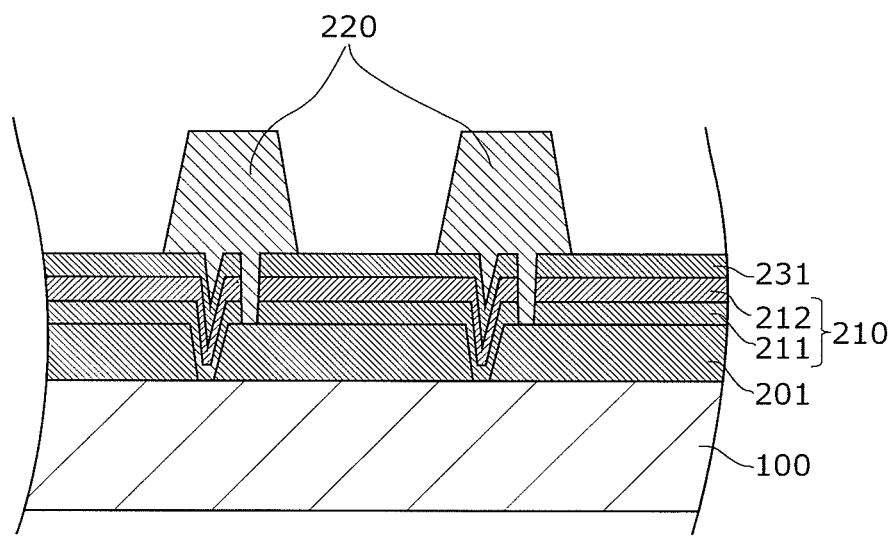
FIG. 18 is a schematic cross-sectional view after a formation of a bank in the manufacturing process of the EL device unit.

As illustrated in FIG. 18, in step 24, the bank 220 is formed. First, the hole injection layer 231 and the anode 210 are patterned into a pixel shape. Specifically, an opening region is formed in the hole injection layer 231 and the anode 210 by photolithography and etching using a resist.

For example, a photosensitive resin is used as the bank 220. Specifically, for example, a resin composition containing an acrylate compound that includes a radical reactive unsaturated compound, a resin composition containing a mercapto compound that includes an acrylate compound and a thiol group, or a resin composition in which multifunctional acrylate monomer, such as epoxy acrylate, urethane acrylate, polyester acrylate, polyether acrylate, polyethylene glycol acrylate, glycerol methacrylate, or the like, is dissolved is used. Furthermore, an arbitrary mixture of the above-described resin compositions can also be used. Note that, the photosensitive resin is not particularly limited as long as a reactive monomer that includes in a molecule at least one photopolymerizable unsaturated bond is contained. The photosensitive resin is dispersed in a solvent.

For example, the photosensitive resin is formed in the aforementioned opening region and on the hole injection layer 231 using an application method. Next, photolithography and development are performed. Next, heat treatment is performed in an air. A temperature of the heat treatment is approximately 150 degrees Celsius to 250 degrees Celsius. A remaining solvent volatilizes due to the heat treatment. The bank 220 after the heat treatment has a film thickness of approximately 0.5 μm to 2 μm. Note that, subsequent processes become easy when a side surface of the bank 220 is in a downward tapered shape, which is preferable.

[2-2-5. Step 25]

Figure 19:
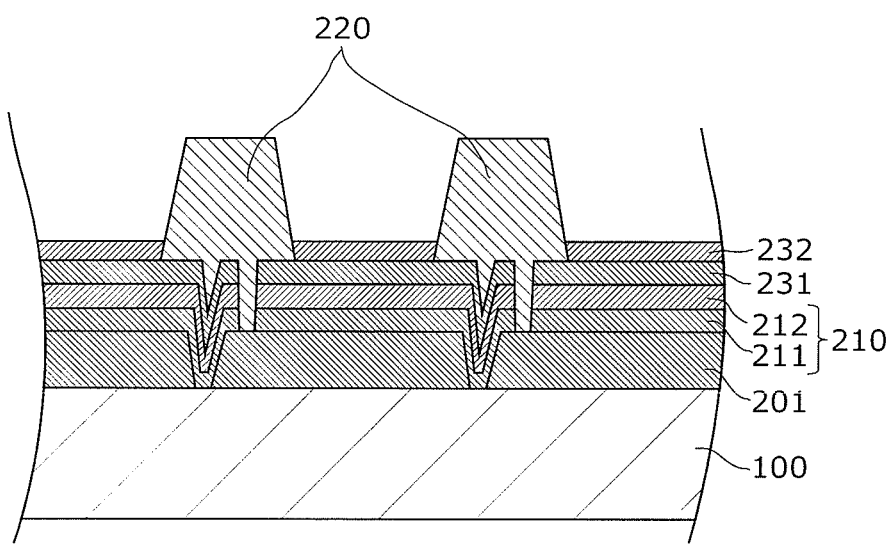
FIG. 19 is a schematic cross-sectional view after a formation of an electron blocking layer in the manufacturing process of the EL device unit.

As illustrated in FIG. 19, in step 25, the electron blocking layer 232 is formed. For example, amine-based polymer is used as the electron blocking layer 232. An amine-based polymer becomes a printing ink, for example, when dispersed in a solvent. The printing ink is applied on the hole injection layer 231, for example, with an ink jet device. Next, vacuum drying and heat treatment are performed. A temperature of the heat treatment is approximately 150 degrees Celsius to 250 degrees Celsius. The solvent volatilizes due to the heat treatment. The electron blocking layer 232 has a film thickness of approximately 5 nm to 20 nm.

[2-2-6. Step 26]

Figure 20:
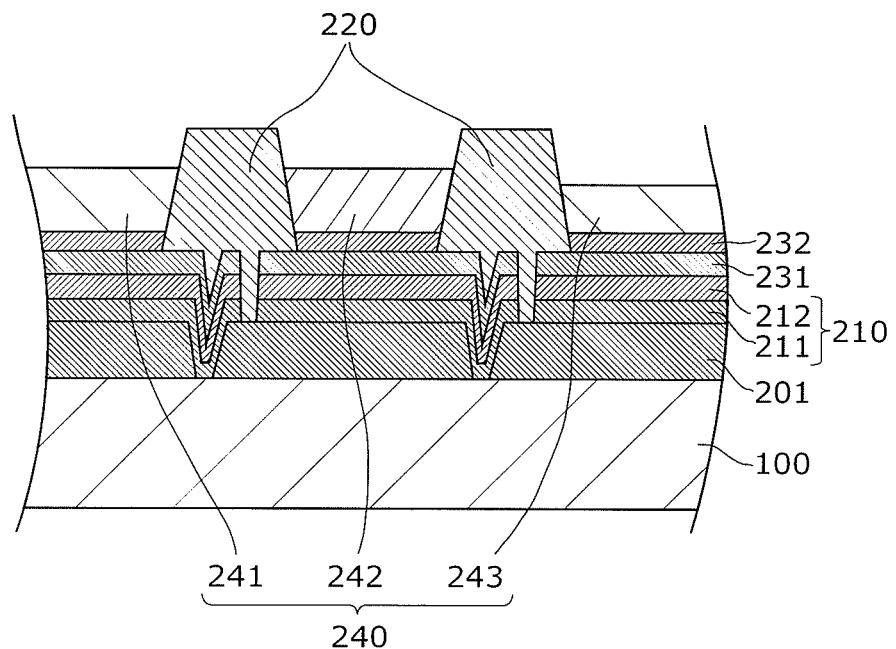
FIG. 20 is a schematic cross-sectional view after a formation of a light-emitting layer in the manufacturing process of the EL device unit.

As illustrated in FIG. 20, in step 26, the light-emitting layer 240 is formed. For example, a material obtained by adding a dopant to a polymeric material host is used as the light-emitting layer 240. The polymeric material becomes a printing ink, for example, when dispersed in a solvent. The printing ink is applied on the electron blocking layer 232, for example, with an ink jet device. The red-light-emitting layer 241, the green-light-emitting layer 242, and the blue-light-emitting layer 243 are individually applied. Note that, when an ink jet device including a plurality of heads is used, the red-light-emitting layer 241, the green-light-emitting layer 242, and the blue-light-emitting layer 243 can be simultaneously applied.

Film thicknesses of the red-light-emitting layer 241, the green-light-emitting layer 242, and the blue-light-emitting layer 243 are appropriately set to balance luminance. More specifically, a color with a relatively great light emission amount per a unit film thickness is set to have a relatively small film thickness. A color with a relatively small light emission amount per the unit film thickness is set to have a relatively great film thickness. The film thickness is adjusted with viscosity of the printing ink, an opening size of a head, or the like. Next, heat treatment is performed. A temperature of the heat treatment is approximately 150 degrees Celsius to 250 degrees Celsius. A remaining solvent volatilizes due to the heat treatment. The light-emitting layer 240 has a film thickness of approximately 40 nm to 100 nm.

[2-2-7. Step 27]

Figure 21:
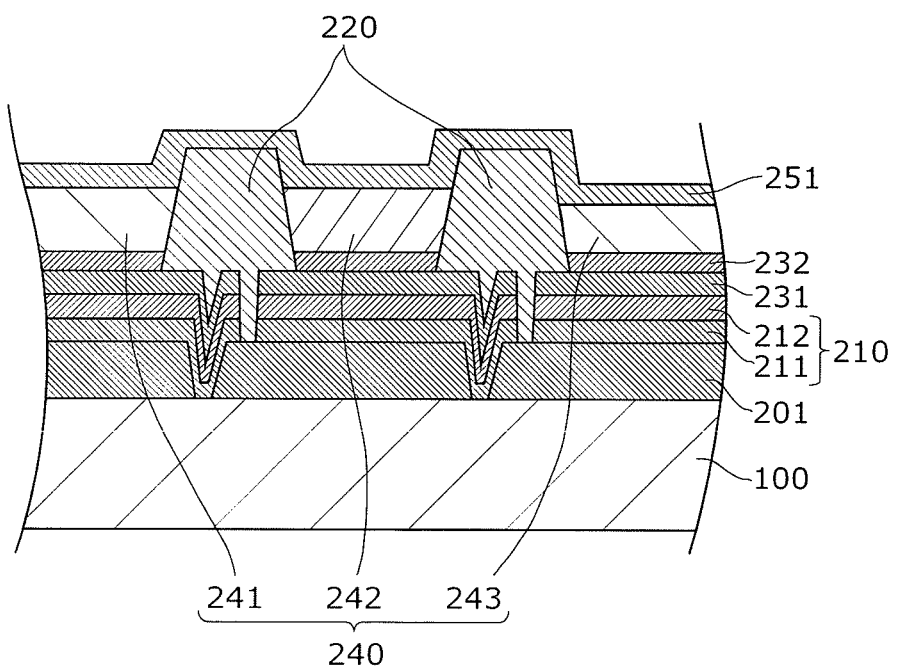
FIG. 21 is a schematic cross-sectional view after a formation of an electron injection layer in the manufacturing process of the EL device unit.

As illustrated in FIG. 21, in step 27, the electron injection layer 251 is formed. For example, a material obtained by adding barium (Ba) to a small molecule material is used as the electron injection layer 251. The material of the electron injection layer 251 is formed on the light-emitting layer 240 and on the bank 220 using, for example, a vapor deposition method. The electron injection layer 251 has a film thickness of approximately 2 nm to 50 nm.

Furthermore, as the electron injection layer 251, an inorganic material, such as an alkali metal compound or an alkaline earth metal compound may be used. In this case, for example, when sodium fluoride that is an alkali metal compound is used as the electron injection layer 251, and aluminum is used as the cathode 260 formed on the electron injection layer 251, the aluminum reduces the sodium fluoride. As a result, the mixture layer 252 that includes aluminum, fluorine and sodium is formed at the interface between the electron injection layer 251 and the cathode 260.

In this manner, when (i) an alkali metal compound or an alkaline earth metal compound is used as the electron injection layer 251, and (ii) a metal which acts to reduce the alkali metal compound or the alkaline earth metal compound is used as the cathode 260, an alkali metal or an alkaline earth metal are present in a disengaged state at the interface between the electron injection layer 251 and the cathode 260. For example, as above, when sodium fluoride (alkali metal compound) is used for the electron injection layer 251, and aluminum is used for the cathode 260, sodium (alkali metal) is present in a disengaged state at the interface between the electron injection layer 251 and the cathode 260. With this, it is assumed that an injection of an electron is facilitated. Thus, use of sodium fluoride and aluminum in combination is highly desirable.

It should be noted that, in addition to the interface between the electron injection layer 251 and the cathode 260, the entirety of the electron injection layer 251 (sodium fluoride layer) may be in a reduced state.

Furthermore, instead of sodium fluoride, an alkali metal compound, such as lithium fluoride, may be used for the electron injection layer 251. Furthermore, instead of aluminum, an alloy or the like of magnesium and silver may be used for the cathode 260. The mixture layer 252 is also formed when these materials are used or when these materials are used in combination with the above-described materials.

[2-2-8. Step 28]

Figure 22:
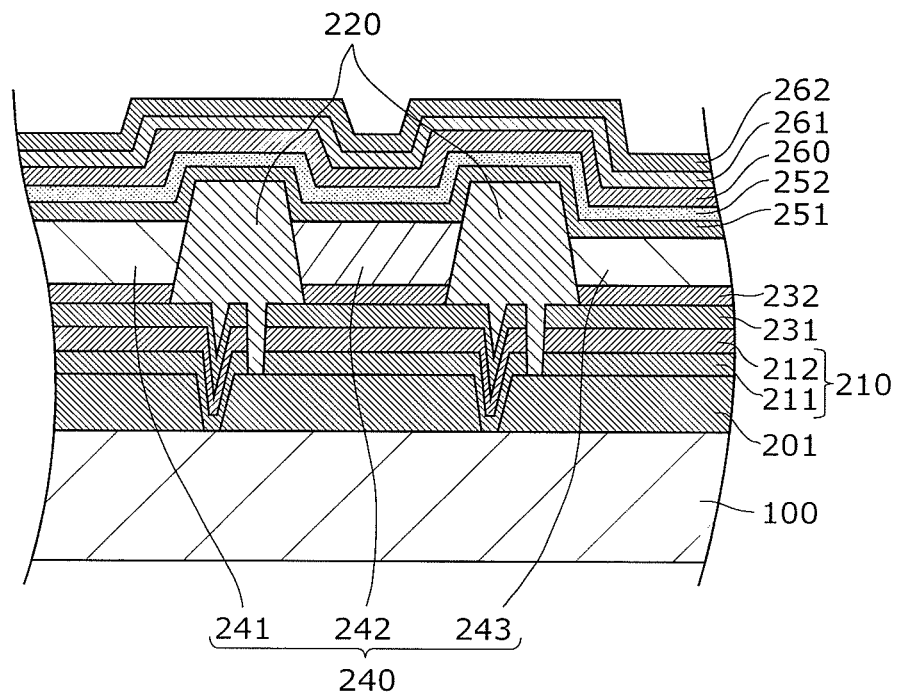
FIG. 22 is a schematic cross-sectional view after a formation of a cathode in the manufacturing process of the EL device unit.

As illustrated in FIG. 22, in step 28, the cathode 260, the oxidation inhibiting layer 261, and the cathode protecting layer 262 are formed. Formation of the cathode 260, the oxidation inhibiting layer 261, and the cathode protecting layer 262 will be described later in detail.

[2-2-9. Step 29]

Figure 23:
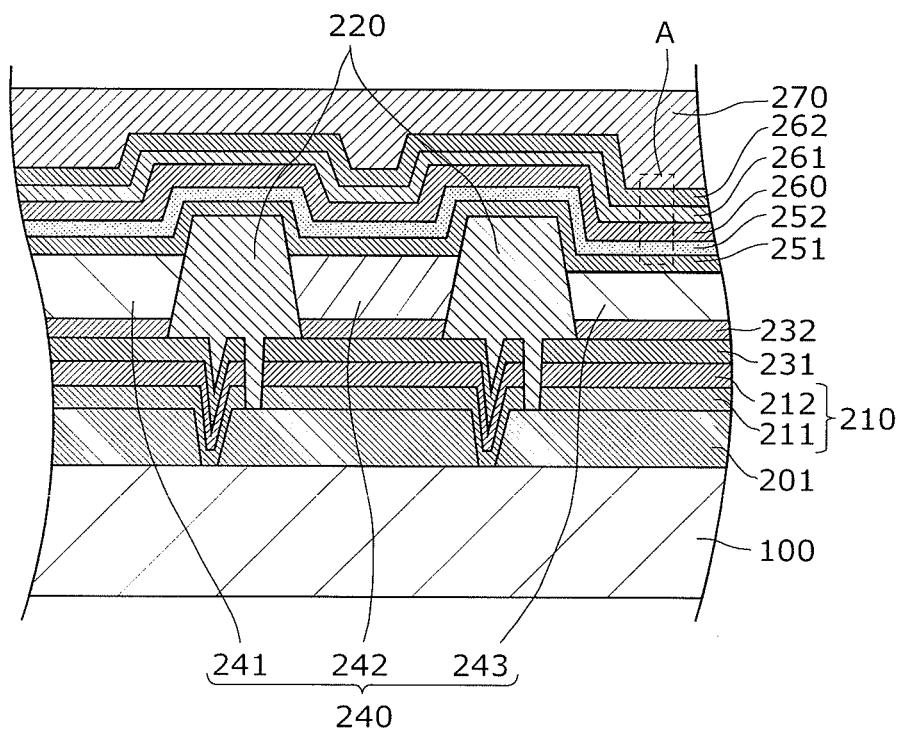
FIG. 23 is a schematic cross-sectional view after a formation of a sealing layer in the manufacturing process of the EL device unit.

As illustrated in FIG. 23, in step 29, the sealing layer 270 is formed. Specifically, the sealing layer 270 is formed on the cathode protecting layer 262 after the cathode 260, the oxidation inhibiting layer 261, and the cathode protecting layer 262 are formed. As the sealing layer 270, an SiN film having a film thickness of approximately 500 nm to 800 nm is formed by parallel-plate type plasma CVD, for example. In this case, a material of the SiN film includes $SiH_4$ and $NH_3$, for example. Note that, it is preferable that step 27 to step 29 be sequentially performed in vacuum. This is because exposure to an atmosphere that includes moisture or the like can be reduced.

With the above-described step 21 to step 29, the EL device unit 200 is made.

[2-3. Manufacturing Method of Color Filter Substrate 300]

The color filter substrate 300 can be made by forming the filter 320 on the glass substrate 310. The filter 320 is formed by photolithography or the like, as it has been known.

[3. Details of Cathode 260, Oxidation Inhibiting Layer 261, and Cathode Protecting Layer 262]

[3-1. Configurations of Cathode 260, Oxidation Inhibiting Layer 261, and Cathode Protecting Layer 262]

Figure 24:
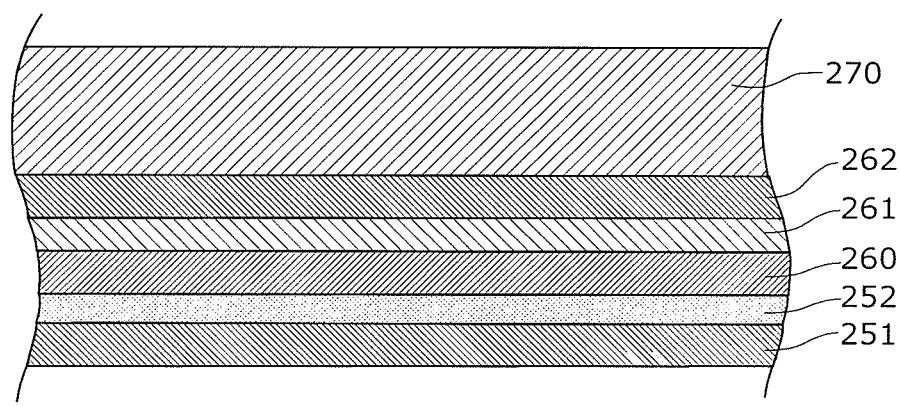
FIG. 24 is a schematic cross-sectional diagram showing a periphery of a cathode in an embodiment.

First, configurations of the cathode 260, the oxidation inhibiting layer 261, and the cathode protecting layer 262 are described with reference to FIG. 24. FIG. 24 is an enlarged cross-sectional view of an area A enclosed by a broken line in FIG. 23.

As illustrated in FIG. 24, in the EL device unit 200 according to this embodiment, the oxidation inhibiting layer 261 and the cathode protecting layer 262 are stacked on the cathode 260, and the sealing layer 270 is formed thereabove. In other words, the oxidation inhibiting layer 261 and the cathode protecting layer 262 are stacked between the cathode 260 and the sealing layer 270. The oxidation inhibiting layer 261 is closer to the light-emitting layer than the cathode protecting layer 262 is.

The cathode 260 is a metal film, and is provided to be an upper layer with respect to the electron injection layer 251. For example, the cathode 260 is formed on the electron injection layer 251 to be in contact with the electron injection layer 251. Furthermore, the organic EL display device 10 is of a top-emission type that emits light from the cathode side. Thus, the metal film that is the cathode 260 transmits light (visible light) emitted by the light-emitting layer.

The cathode protecting layer 262 is provided to be an upper layer with respect to the cathode 260, and to be a lower layer with respect to the sealing layer 270. For example, the cathode protecting layer 262 is formed on the cathode 260 to be in contact with the cathode 260.

It should be noted that, in FIG. 24, layers above the sealing layer 270, and layers below the electron injection layer 251 are omitted.

An example of a metal film material of the cathode 260 is aluminum. It is preferable that the cathode 260 have a film thickness of no less than 5 nm and no more than 15 nm. When the cathode 260 has a film thickness of less than 5 nm, a resistance as a cathode becomes high. On the other hand, when the cathode 260 has a film thickness of more than 15 nm, a transmission factor with respect to visible light decreases.

As the oxidation inhibiting layer 261, for example, a material including an organic component, such as an oxadiazole derivative or a triazole derivative, is used. It is preferable that the oxidation inhibiting layer 261 have a film thickness of no less than 15 nm and no more than 80 nm. The oxidation inhibiting layer 261 having a film thickness of less than 15 nm functions less effectively in preventing oxidation. On the other hand, the oxidation inhibiting layer 261 having a film thickness of more than 80 nm has a decreased transmission factor with respect to visible light.

As the cathode protecting layer 262, for example, a metal oxide that transmits visible light is used. A specific example is ITO, IZO, or the like. It is preferable that the cathode protecting layer 262 have a film thickness of no less than 15 nm and no more than 50 nm. The cathode protecting layer 262 having a film thickness of less than 15 nm functions less effectively in preventing oxidation. On the other hand, when the cathode protecting layer 262 has a film thickness of more than 50 nm, oxidation of a metal film of the cathode 260 conversely increases.

[3-2. Formation Methods of Cathode 260, Oxidation Inhibiting Layer 261, and Cathode Protecting Layer 262]

Figure 25:
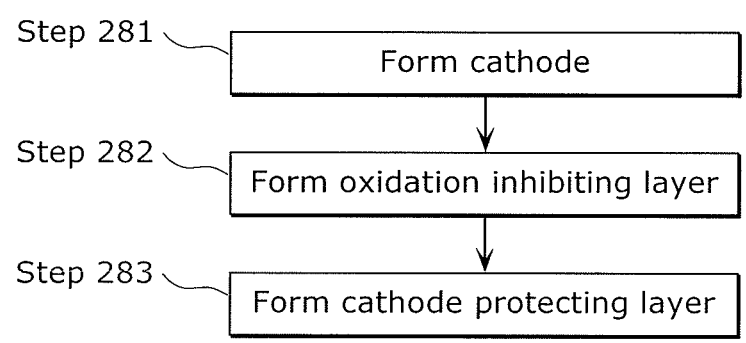
FIG. 25 is a manufacturing flow diagram of the cathode, an oxidation inhibiting layer, and a cathode protecting layer.

Next, details of a formation method (step 28) of the cathode 260, the oxidation inhibiting layer 261, and the cathode protecting layer 262 is described with reference to FIG. 24 and FIG. 25.

First, a metal film is formed (step 281) as the cathode 260 above the light-emitting layer 240. Specifically, as the cathode 260, a metal film is formed on the electron injection layer 251. The cathode 260 is formed using, for example, a vacuum vapor deposition method with resistance heating. When aluminum is used for a vapor deposition material, an aluminum film is formed. The film thickness of the cathode 260 is appropriately adjusted by a degree of vacuum of a vacuum vapor deposition apparatus, a current passed to a container containing a vapor deposition material, or the like.

Here is a case where the electron injection layer 251 is an alkali metal compound, such as a sodium fluoride layer or the like. In a manufacturing step of forming the cathode 260, due to formation of an aluminum film as the cathode 260 on the electron injection layer 251, aluminum of the cathode 260 reduces sodium fluoride of the electron injection layer 251. As a result, the mixture layer 252 that includes aluminum, fluorine, and sodium is formed at an interface between the electron injection layer 251 and the cathode 260.

Next, the oxidation inhibiting layer 261 is formed above the cathode 260 (step 282). At this time, after the formation of the cathode 260 and before the formation of the oxidation inhibiting layer 261, exposure of the cathode 260 to an atmosphere may be avoided. In other words, the cathode 260 and the oxidation inhibiting layer 261 may be sequentially formed in a vacuum. For example, in a same vacuum vapor deposition apparatus, a vapor deposition material is switched from aluminum to, for example, an oxadiazole derivative. With this, the oxidation inhibiting layer 261 can be formed on the cathode 260 while maintaining a vacuum state, which can reduce oxidation of the cathode 260.

Next, the cathode protecting layer 262 is formed above the oxidation inhibiting layer 261 (step 283). The cathode protecting layer 262 is formed by sputtering, for example. When ITO is used for a target, an ITO film is formed. When IZO is used for a target, an IZO film is formed. Input gases are argon and oxygen. The film thickness of the cathode protecting layer 262 is appropriately adjusted by a degree of vacuum of a sputtering apparatus, applied power, or the like.

[3-3. Evaluation Results]

The organic EL display devices 10 of various types are actually made which include the cathodes 260, and drive voltages and lifetimes are evaluated when green light is emitted. The evaluation results are described with reference to FIG. 26 and FIG. 27.

Figure 26:
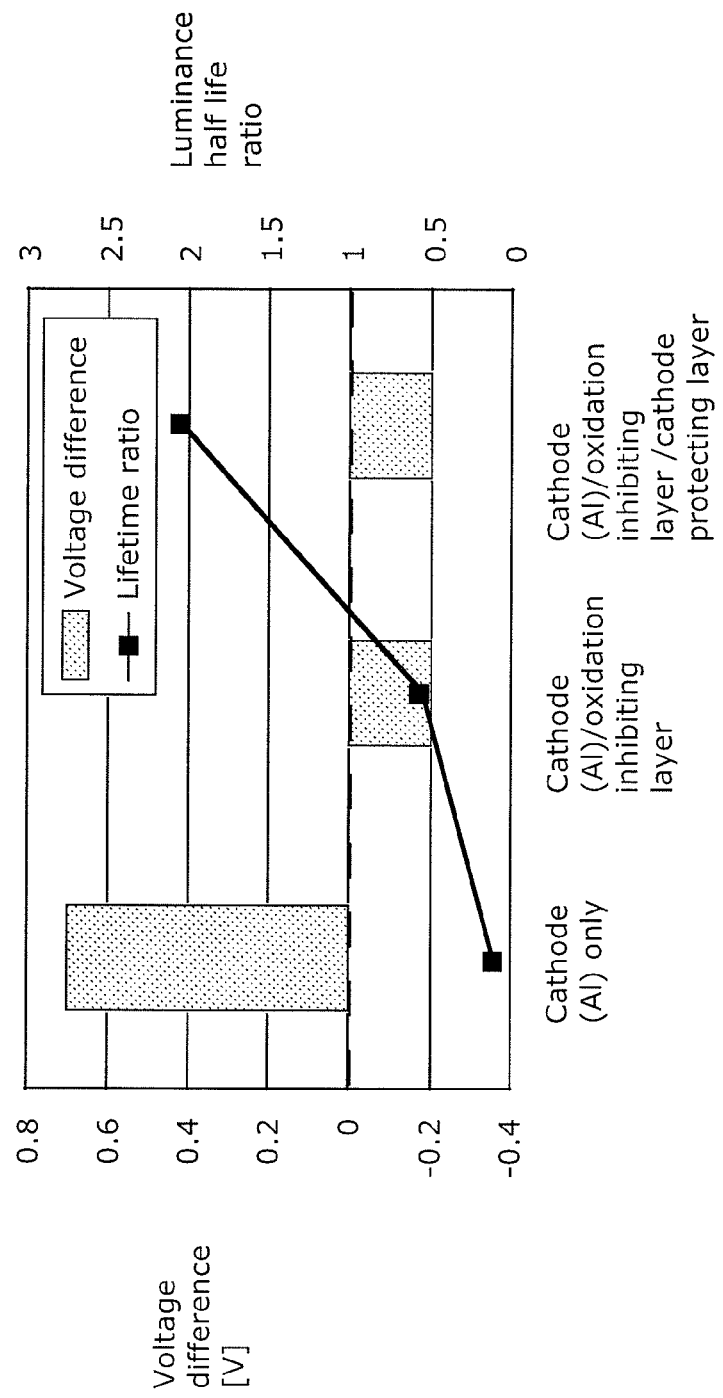
FIG. 26 is a diagram showing relationships of drive voltages and luminance half lives of organic EL display devices on a cathode and stacked films including cathodes.

First, in FIG. 26, evaluations are made on cases in which the cathode 260 that is an Al film is provided with or without the oxidation inhibiting layer 261 and the cathode protecting layer 262. It should be noted that the cathode 260 (Al film) has a film thickness of 10 nm, the oxidation inhibiting layer 261 has a film thickness of 35 nm, and the cathode protecting layer 262 has a film thickness of 35 nm.

As illustrated in FIG. 26, a first sample having a structure in which the cathode 260 includes only an Al metal film (i.e., the oxidation inhibiting layer 261 and the cathode protecting layer 262 are not included) has a drive voltage that is higher by approximately 0.7 V relative to a performance requirement, and a lifetime that is $\frac{1}{10}$ relative to a performance requirement, and luminance half life is short.

In the case of a sample 2 having a structure in which the oxidation inhibiting layer 261 is stacked on the cathode 260 (i.e., the cathode protecting layer 262 is not included), although a drive voltage is lowered and the performance requirement is satisfied in terms of the drive voltage, a lifetime ratio is approximately 50%. In other words, in terms of lifetime, although improvement is observed compared to the first sample, the second sample fails to satisfy the performance requirement, and has an unsatisfactory luminance half life.

Furthermore, in the case of a third sample having a structure in which the oxidation inhibiting layer 261 and the cathode protecting layer 262 are stacked on the cathode 260, a drive voltage is lowered and a performance requirement is satisfied in terms of the drive voltage, and a luminance half life is improved and a performance requirement can be satisfied in terms of lifetime as well. In this manner, the third sample can achieve both lowering of the drive voltage and improvement on the luminance half life.

The results in FIG. 26 suggest that providing only the oxidation inhibiting layer 261 is effective in reducing oxidation of the cathode 260 in an initial characteristic, but is unsatisfactory in reducing oxidation of the cathode 260 during a long period of driving. However, the results indicate that the configuration in which the cathode protecting layer 262 is further provided on the oxidation inhibiting layer 261 is effective in reducing oxidation of the cathode 260 during a long period of driving as well.

Figure 27:
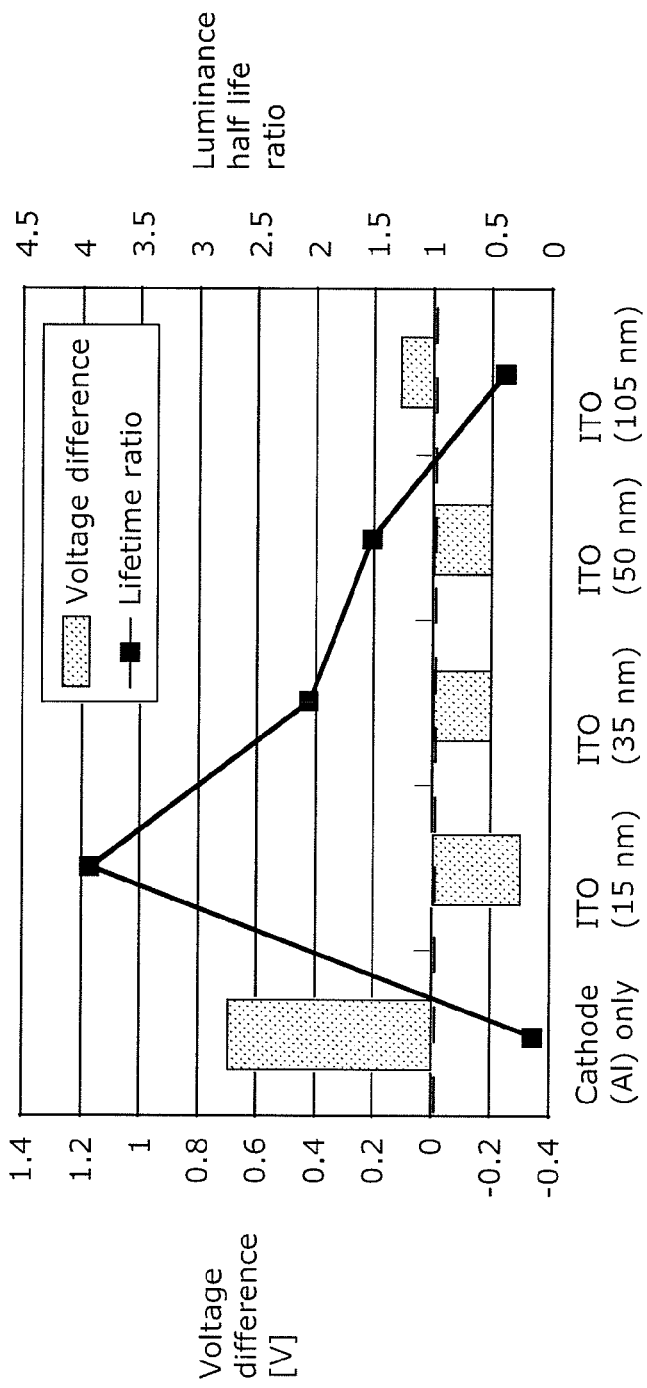
FIG. 27 is a diagram showing dependency of drive voltages and luminance half lives of organic EL display devices on film thicknesses of cathode protecting layers.

Furthermore, in FIG. 27, relationships are evaluated among the film thicknesses of the cathode protecting layer 262 that is an ITO film, drive voltages, and lifetimes. Specifically, drive voltages and lifetimes are evaluated on the cases in which the film thickness of the cathode protecting layer 262 is 0 nm, 15 nm, 35 nm, 50 nm, and 105 nm. It should be noted that, in FIG. 27, in the sample including the cathode protecting layer 262 (ITO film), the oxidation inhibiting layer 261 having a film thickness of 35 nm is provided. Furthermore, the cathode, 260 is an aluminum film having a film thickness of 10 nm.

FIG. 27 indicates that, with the cathode protecting layer 262 (ITO film) having a film thickness of no less than 15 nm and no more than 50 nm, a drive voltage lowers, and a drive voltage that satisfies the performance requirement is realized. However, in the case in which the cathode protecting layer 262 (ITO film) has a film thickness of 105 nm, the drive voltage is higher relative to the performance requirement although by a matter of approximately 0.1 V. This indicates that excess increase in the film thickness of the cathode protecting layer 262 (ITO film), conversely, results in an increase in a drive voltage.

Furthermore, FIG. 27 also indicates that, with the cathode protecting layer 262 having a film thickness of no less than 15 nm and no more than 50 nm, the luminance half life improves and the performance requirement is satisfied in terms of lifetime. However, with an increase in a film thickness of the cathode protecting layer 262, the luminance half life also gradually reduces. When the cathode protecting layer 262 has a film thickness of more than 105 nm, the lifetime ratio becomes approximately 50% and the performance requirement is not satisfied in terms of lifetime. As described, the luminance half life decreases with an increase in the film thickness of the cathode protecting layer 262. This is assumed to occur because the increase in the film thickness causes the cathode 260 to be exposed to an oxygen atmosphere for a long period of time when the cathode protecting layer 262 (ITO film) is formed, and thus oxidation of the cathode 260 advances.

[4. Summary]

As described above, the organic EL display device 10 includes the anode 210, the cathode 260 that is a metal film, the light-emitting layer 240 provided between the anode 210 and the cathode 260, and the sealing layer 270 that covers a side of the cathode 260 opposite a side on which the light-emitting layer 240 is provided. Furthermore, the oxidation inhibiting layer 261 and the cathode protecting layer 262 are stacked between the cathode 260 and the sealing layer 270. The oxide inhibiting layer 261 is closer to the light-emitting layer 240 than the cathode protecting layer 262 is.

The above-described configuration reduces oxidation of the cathode 260. With this, increase in the drive voltage and decrease in luminance half life can be reduced.

It should be noted that the oxidation inhibiting layer 261 may include an organic component. In addition, it is preferable that the oxidation inhibiting layer 261 have a film thickness of no less than 15 nm and no more than 80 nm.

This configuration makes it possible to reduce the decrease in (i) the oxidation-prevention effect for the cathode 260 and (ii) the transmission factor of the oxidation inhibiting layer 261.

Furthermore, the cathode protecting layer 262 may be a metal oxide that transmits visible light. In addition, it is preferable that the cathode protecting layer 262 have a film thickness of no less than 15 nm and no more than 50 nm.

This configuration makes it possible to reduce the decrease in the oxidation-prevention effect for the cathode 260, and satisfy the performance requirement in terms of lifetime.

Furthermore, the mixture layer 252 may be formed at an interface between the electron injection layer 251 and the cathode 260. The mixture layer 252 is a layer in which a material included in the electron injection layer 251 and a material included in the cathode 260 are mixed. In this case, the electron injection layer 251 may be an alkali metal compound or an alkaline earth metal compound, and the cathode 260 may be a metal which reduces the alkali metal compound or the alkaline earth metal compound. For example, the electron injection layer 251 may be sodium fluoride, and the cathode 260 may be aluminum. In this case, the mixture layer 252 includes fluorine, sodium, and aluminum as the material included in the electron injection layer 251 and the material included in the cathode 260.

With this configuration, an injection of an electron is facilitated and thus light-emission efficiency of the light-emitting layer 240 can be improved.

Furthermore, a method of manufacturing the organic EL display device 10 includes: a manufacturing step (step 22) of forming the anode 210; a manufacturing step (step 26) of forming the light-emitting layer 240 above the anode 210; a manufacturing step (step 281) of forming the cathode 260 above the light-emitting layer 240, where the cathode 260 is a metal film; a manufacturing step (step 282) of forming the oxidation inhibiting layer 261 above the cathode 260, where the cathode 260 and the oxidation inhibiting layer 261 are sequentially formed in a vacuum; a manufacturing step (step 283) of forming the cathode protecting layer 262 above the oxidation inhibiting layer 261; and a manufacturing step (step 29) of forming the sealing layer 270 above the cathode 260.

With the above-described method, an organic EL display device in which the oxidation of the cathode 260 is reduced can be realized. With this, an organic EL display device which can reduce (i) increase in a drive voltage and (ii) the decrease in luminance half life can be realized.

Furthermore, a manufacturing step of forming the electron injection layer 251 above the light-emitting layer 240 may be included between the manufacturing step of forming the light-emitting layer 240 and the manufacturing step of forming the cathode 260. In this case, in the manufacturing step of forming the cathode 260, the cathode 260 may be formed on the electron injection layer 251 to form the mixture layer 252 at the interface between the electron injection layer 251 and the cathode 260. The mixture layer 252 is a layer in which a material included in the electron injection layer 251 and a material included in the cathode 260 are mixed. In this case, the electron injection layer 251 may be an alkali metal compound or an alkaline earth metal compound, and the cathode 260 may be a metal which reduces the alkali metal compound or the alkaline earth metal compound. For example, the electron injection layer 251 may be sodium fluoride, and the cathode 260 may be aluminum.

With this configuration, aluminum reduces sodium fluoride, and the mixture layer 252 including aluminum, fluorine, and sodium is formed at the interface between the electron injection layer 251 and the cathode 260. In this manner, sodium in a disengaged state is present at the interface between the electron injection layer 251 and the cathode 260. This facilitates injection of an electron.

An organic EL display device and a manufacturing method of the organic EL display device have been described thus far based on the embodiment, but the present invention is not limited to the above-described embodiment. For example, embodiments obtained through various modifications to the above-described embodiment which may be conceived by a person skilled in the art as well as embodiments realized by arbitrarily combining the structural elements and functions of the embodiment without materially departing from the essence of the present invention are included in the present invention.

INDUSTRIAL APPLICABILITY

The disclosed technique is applicable to an organic EL display device or the like which is used for a display device or the like.

REFERENCE SIGNS LIST

10 Organic EL display device
20 Attaching layer
100 TFT substrate
101 Gate electrode
102 Gate insulating film
110 Glass substrate
111 Semiconductor layer
120 First insulating layer
130 First electrode
140 Protective layer
141 First protective layer
142 Second protective layer
150 Second electrode
151 Lower layer electrode
152 Upper layer electrode
161 Second insulating layer
170 TFT unit
171 Switching TFT
172 Drive TFT
180 Gate line
190 Source line
200 EL device unit
201 Planarizing layer
210 Anode
211 Lower layer anode
212 Upper layer anode
220 Bank
231 Hole injection layer
232 Electron blocking layer
240 Light-emitting layer
241 Red-light-emitting layer
242 Green-light-emitting layer
243 Blue-light-emitting layer
251 Electron injection layer
252 Mixture layer
260 Cathode
261 Oxidation inhibiting layer
262 Cathode protecting layer
270 Sealing layer
300 Color filter substrate
310 Glass substrate
320 Filter
321 Red filter
322 Green filter
323 Blue filte

The invention claimed is:

1. An organic electroluminescence (EL) display device, comprising:
an anode;
a cathode that is a metal film;
a light-emitting layer between the anode and the cathode; and
a sealing layer that covers a side of the cathode opposite a side on which the light-emitting layer is provided,
wherein an oxidation inhibiting layer and a cathode protecting layer are stacked between the cathode and the sealing layer, the oxidation inhibiting layer being closer to the light-emitting layer than the cathode protecting layer,
the cathode protecting layer is a metal oxide that transmits visible light, and
the cathode protecting layer has a film thickness of no less than 15 nm and no more than 50 nm.

2. The organic EL display device according to claim 1, wherein the oxidation inhibiting layer includes an organic component.

3. The organic EL display device according to claim 2, wherein the oxidation inhibiting layer has a film thickness of no less than 15 nm and no more than 80 nm.

4. An organic electroluminescence (EL) display, comprising:
an anode;
a cathode that is a metal film;
a light-emitting layer between the anode and the cathode;
an electron injection layer between the light-emitting layer and the cathode;
a sealing layer that covers a side of the cathode opposite a side on which the light-emitting layer is provided,
wherein an oxidation inhibiting layer and a cathode protecting layer are stacked between the cathode and the sealing layer, the oxidation inhibiting layer being closer to the light-emitting layer than the cathode protecting layer,
a mixture layer is formed at an interface between the electron injection layer and the cathode, the mixture layer being a layer in which a material included in the electron injection layer and a material included in the cathode are mixed,
the electron injection layer is an alkali metal compound or an alkaline earth metal compound, and
the cathode is a metal which reduces the alkali metal compound or the alkaline earth metal compound.

5. The organic EL display device according to claim 4,
wherein when the electron injection layer is sodium fluoride and the cathode is aluminum, and
the mixture layer includes fluorine, sodium, and aluminum, as the material included in the electron injection layer and the material included in the cathode.

6. A method of manufacturing an organic electroluminescence (EL) display device, the method comprising:
forming an anode;
forming a light-emitting layer above the anode;
forming an electron injection layer above the light-emitting layer;
forming a cathode above the light-emitting layer, the cathode being a metal film;
forming an oxidation inhibiting layer above the cathode, the cathode and the oxidation inhibiting layer being sequentially formed in a vacuum;
forming a cathode protecting layer above the oxidation inhibiting layer; and
forming a sealing layer above the cathode,
wherein in the forming of the cathode, the cathode is formed on the electron injection layer to form a mixture layer at an interface between the electron injection layer and the cathode, the mixture layer being a layer in which a material included in the electron injection layer and a material included in the cathode are mixed,
the electron injection layer is an alkali metal compound or an alkaline earth metal compound, and
the cathode is a metal which reduces the alkali metal compound or the alkaline earth metal compound.

7. The method according to claim 6,
wherein when the electron injection layer is sodium fluoride and the cathode is aluminum, the mixture layer includes fluorine, sodium, and aluminum, as the material included in the electron injection layer and the material included in the cathode.

8. The organic EL display device according to claim 1, wherein the cathode protecting layer comprises indium tin oxide.

9. The organic EL display device according to claim 4, wherein the oxidation inhibiting layer includes an organic component.

10. The organic EL display device according to claim 4, wherein the oxidation inhibiting layer has a film thickness of no less than 15 nm and no more than 80 nm.

* * * * *